United States Patent [19]

Yamada et al.

[11] 4,139,791
[45] Feb. 13, 1979

[54] DAMPING STRUCTURE FOR ELASTIC SURFACE WAVE DEVICE

[75] Inventors: Akira Yamada; Hitoshi Suzuki, both of Yokohama, Japan

[73] Assignee: Tokyo Shibaura Electric Co., Ltd., Kawasaki, Japan

[21] Appl. No.: 826,837

[22] Filed: Aug. 22, 1977

[30] Foreign Application Priority Data

Aug. 24, 1976 [JP] Japan .................................. 51-100253

[51] Int. Cl.² ........................................... H01L 41/10
[52] U.S. Cl. .................................... 310/313; 310/326; 333/30 R
[58] Field of Search ..................... 310/313, 326, 372; 333/72, 30 R

[56] References Cited

U.S. PATENT DOCUMENTS

| | | | |
|---|---|---|---|
| 3,715,674 | 2/1973 | Bahr | 333/30 R X |
| 3,908,137 | 9/1975 | Hunsinger et al. | 310/313 X |
| 4,030,050 | 6/1977 | Deacon | 310/313 X |
| 4,034,318 | 7/1977 | Ishiyama et al. | 310/313 X |

*Primary Examiner*—Mark O. Budd
*Attorney, Agent, or Firm*—Flynn & Frishauf

[57] ABSTRACT

An elastic surface wave device comprises a piezoelectric substrate; input and output interdigital transducers provided on one surface of the piezoelectric substrate and mutually spaced apart from each other to define a surface wave propagation path therebetween; and a surface wave absorber partially overlappingly provided on that end portion of at least one of the transducers which lies on an extension of the surface wave propagation path, the absorber having opposite side edges diagonally intersecting with respect to the surface wave propagation path.

9 Claims, 7 Drawing Figures

DAMPING STRUCTURE FOR ELASTIC SURFACE WAVE DEVICE

BACKGROUND OF THE INVENTION

This invention relates to an elastic surface wave device of which the characteristics are improved by using an elastic surface wave absorber having a particular configuration.

Attempts have conventionally been made to improve the characteristics of an elastic surface wave device by using an elastic surface wave absorber. Such a surface wave device is shown, by way of example, in FIG. 1. In this Figure an interdigital type input transducer 2 and interdigital type output transducer 3 are provided at a predetermined interval on one surface 1 of a piezoelectric substrate. A surface wave propagation path is provided by that surface portion of the substrate which is provided between the transducers 2 and 3. On the extension of the surface wave propagation path, surface wave absorbers 4 and 5 of rectangular configuration are provided one at each end portion of the piezoelectric substrate such that their side edges intersect substantially orthogonal to the surface wave propagation path. The interdigital electrodes 2a and 2b in the input transducer 2 have common connection electrodes 2a-1 and 2b-1, respectively, across a surface wave signal source 6, and the respective common connection electrodes 2a-1 and 2b-1 have a plate-like portion as shown in FIG. 1 except for the overlapped portions of the digit electrodes. As a result, it is possible to prevent unwanted surface waves from being reflected on those digit electrode sections except for the overlapped portions of the digit electrodes. The interdigital electrodes 3a and 3b of the output transducer 3 have common connections 3a-1 and 3b-1, respectively, and are connected to, for example, a load 7.

When a surface wave signal is supplied from a surface wave signal source 6 to the transducer 2 on the conventional surface wave device, a normal surface wave A is transmitted from the input transducer 2 toward the output transducer 3 as shown in FIG. 1 and there are reflected surface waves B to I which reach the output transducer 3 through various paths from the input transducer 2. That is, the reflected surface wave B reaches the output transducer 3 after reflected on the rear end of the input transducer 2, the surface wave C is reflected several times between the input and output transducers 2 and 3, a surface wave D is incident upon the output transducer after reflected on the front edge of the absorber 5 which is disposed behind the output transducer 3, a surface wave E is incident upon the output transducer 3 after reflected on the front edge of the absorber 4 disposed behind the input transducer 2, a surface wave F is incident onto the output transducer 3 after reflected on the rear edge of the absorber 5 on the output side, a surface wave G is incident onto the output transducer after reflected on the rear end of the absorber 4 on the input side, a surface wave H is reflected to the output transducer 3 after reflected on that substrate 1 end at the output side of the substrate 1, and a surface wave I is incident onto the output transducer 3 after reflected on the substrate 1 end on the input side of the substrate 1.

The reflected wave C can be reduced by adjusting the value of the load 7 and the reflected waves D to I be reduced by properly selecting the material and dimension of the absorbers 4 and 5. The suitable choice of the shape of the end surface of the piezoelectric substrate 1 reduces the extent to which the surface waves are reflected at the respective locations, thereby preventing degradation of the characteristics of the surface wave device. However, the surface wave B can not be reduced by any of the above-mentioned methods and it is difficult to prevent degradation of the characteristics of the surface wave device due to the presence of the reflected wave B.

It is accordingly the object of this invention to provide an excellent elastic surface wave device which can alleviate any influence resulting from surface waves reflected on the ends of transducers in particular.

SUMMARY OF THE INVENTION

The above-mentioned object can be attained by partially overlappingly providing a surface wave absorber on that end portion of a piezoelectric substrate which lies on an extension of a surface wave propagation path, the surface wave absorber including opposite end edges diagonally intersecting with respect to the surface wave propagation direction.

In one aspect of this invention there is provided an elastic surface wave device comprising a piezoelectric substrate; interdigital type input and output transducers provided on one surface of the piezoelectric substrate and mutually spaced apart from each other to define a surface wave propagation path therebetween; and a surface wave absorber partially overlappingly provided on that end portion of at least one of the input and output transducers which lies on an extension of the surface wave propagation path, the absorber having opposite end edges diagonally intersecting with respect to the surface wave propagation path.

DETAILED DESCRIPTION

Figure 1:
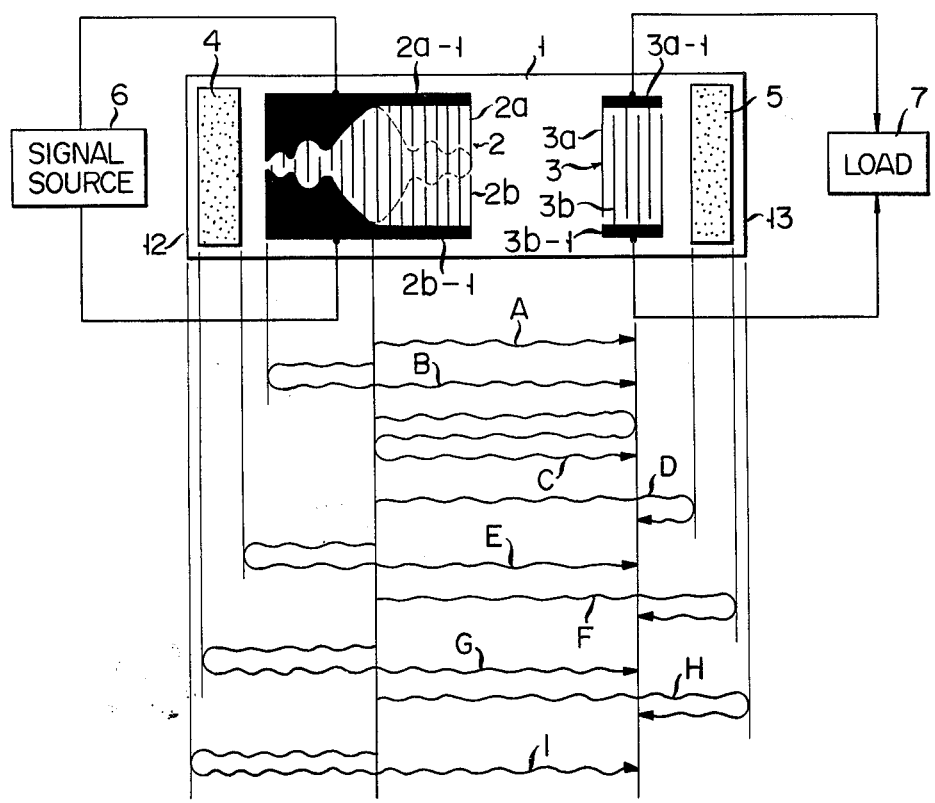
FIG. 1 is a schematic view showing a conventional elastic surface wave device using a surface wave absorber.
Figure 2A:
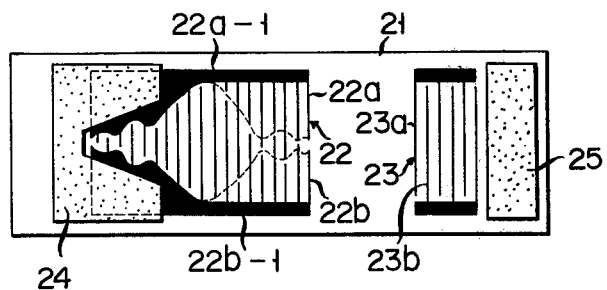
FIG. 2A is a schematic view showing an elastic surface wave device according to one embodiment of this invention.
Figure 2B:
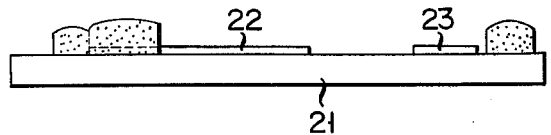
FIG. 2B is a side view showing the device of FIG. 2A.
Figure 3:
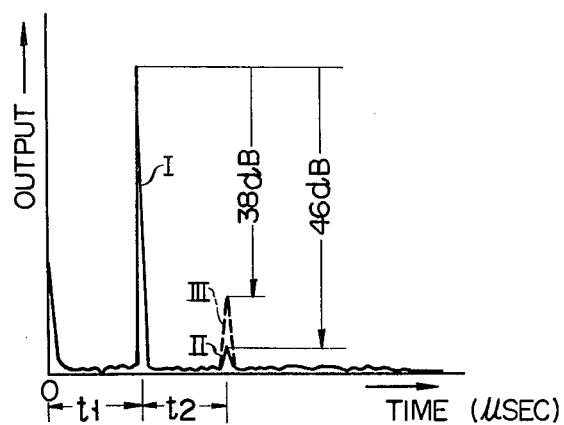
FIG. 3 is a signal waveform for explaining the operation of the device of FIGS. 2A and 2B.

In FIGS. 2A and 2B a piezoelectric substrate 21 is formed of, for example, lithium tantalate (LiTaO$_3$). An interdigital type input transducer 22 and interdigital type output transducer 23 are provided at a predetermined interval on one surface of an LiTaO$_3$ substrate 21. An elastic surface wave propagation path is provided on the substrate 1 portion between the transducers 22 and 23. The input transducer 22 is constructed of two interdigital electrodes 22a and 22b each having a plurality of digit electrodes. The digit electrodes have their overlapped portions varied in width along a weighted pattern. The pattern is used where, for example, the elastic surface wave device of this invention is employed as a picture intermediate frequency (PIF) stage filter of a color TV receiver. A part of the non-overlapped portions of the digit electrodes in the interdigital electrodes 22a and 22b are shown coated with an electroconductive material so that reflection of any unwanted surface waves can be prevented on the non-overlapped portions of the digit electrodes. Those coated portions of the digit electrodes are used as electrode terminals 22a-1 and 22b-1 of the digital electrodes 22a and 22b. A surface wave absorber 24 is provided overlappingly on those rear edge portions of the electrode terminals 22a-1 and 22b-1 as viewed in the direction of propagation of the surface wave. As the surface wave absorber 24 use may be made of, for example, #4033 ink manufactured by Markem Company of U.S.A. The surface wave absorber 24 almost completely covers the rear edge portions of the electrode terminals and is formed in such a V-shape pattern that its opposite edge portions diagonally intersect in the direction of propagation of the surface wave. The output transducer 23 is constructed of a pair of interdigital electrodes 23a, 23b each having a plurality of digit electrodes, and the overlapped portions of the digit electrodes of the interdigital electrodes 23a and 23b are formed to have fixed widths. Between the output transducers 23 and one end of the piezoelectric substrate 21 a surface wave absorber 25 of rectangular configuration is mounted such that its longitudinal sides intersect substantially normal to the direction of propagation of the surface wave. The surface wave absorber 25 is made of the same material as that of the surface wave absorber 24. The absorber 25 may be partially overlappingly formed on the electrode terminal of the output transducer 23. In operation, when an input signal is applied to the input transducer 22 a main signal output I is received in the output transducer 23 after a slight time t1 as shown in FIG. 3. Further, a slight response II occurs on the output transducer 23 after a slight time t2 due to a wave (corresponding to a reflection wave B in FIG. 1) reflected on the rear edge of the input transducer 22. The slight response II of the output of the output transducer 23 has at a level ratio below 46dB with respect to the main signal output I as will be seen from FIG. 3 and it will be appreciated that the reflected wave is properly damped. A response III occurs due to a reflected wave B arising from a conventional surface wave device and has a level about 8dB higher than the level of the surface wave device of this invention. From the graph of FIG. 3 it will be seen that a great reflected wave prevention effect will be obtained from the surface wave device of this invention.

Figure 4:
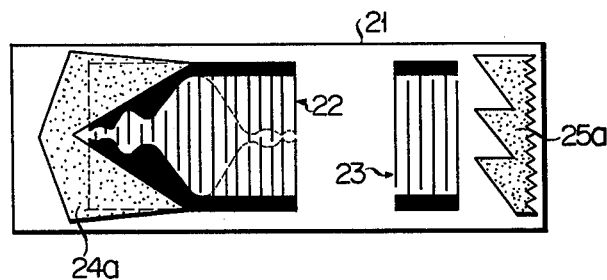
FIG. 4 is a schematic view showing another embodiment of this invention.

In the embodiment shown in FIGS. 2A and 2B the surface wave absorber 24 provided with respect to the input transducer 22 has, at its notched end, those portions which are made orthogonal to the direction of propagation of the surface wave. In order to further reduce such reflected wave all the end edge portions of the surface wave absorber 24a are formed in a manner to diagonally intersect with respect to the direction of propagation of the surface wave (FIG. 4) and, in addition, a surface wave absorber 25a on the side of an output transducer 23 may have a serrated portion whose teeth diagonally intersect with respect to the direction of propagation of the surface wave (FIG. 4).

Figure 5:
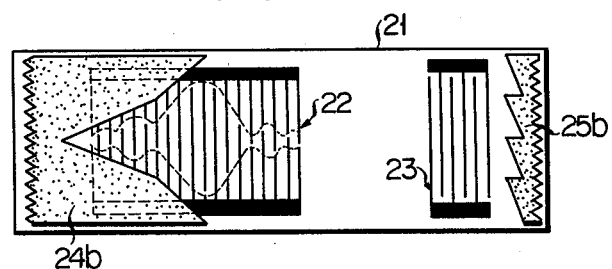
FIG. 5 is a schematic view showing another embodiment of this invention.

In any of the above-mentioned embodiments the non-overlapped portions of the digit electrodes of the input transducer are formed as an integral electroconductive film on which the surface wave absorber 24 is partially overlappingly provided. As shown in FIG. 5, however, the non-overlapped portions of the digit electrodes may be left uncoated and an electrically insulating surface wave absorber 24b be formed on the overlapped portions of the digit electrodes. In the surface wave device shown in FIG. 5 one end edge of the surface wave absorber 24b includes a notch of which the opposite side edges diagonally intersect with respect to the surface wave propagation path, and the other end edge of the surface wave absorber 24b is away from the surface wave propagation path and has a small-toothed section.

Figure 6:
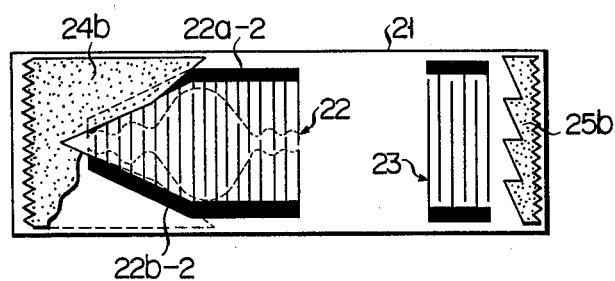
FIG. 6 is a schematic view showing another embodiment of this invention.

In the embodiments as shown in FIGS. 2A, 2B, 4 and 5, in order to prevent reflection of surface waves the non-overlapped portions of the digit electrodes of the interdigital electrode constituting the input transducer are either formed as the integral electroconductive film, or left intact so that they are coated with the electrically insulating absorber. As shown in FIG. 6, however, the non-overlapped portions of the digit electrodes may be removed and electroconductive terminals 22a-2 and 22b-2 be formed there. In this case, there is no fear that reflection of surface waves will not occur at the non-overlapped portions of the digit electrodes.

According to this invention, even if the reflection property of the absorber edge is subject to some aging, since the end edge of the absorber is formed to diagonally cross with respect to the surface wave propagation direction, an excellent surface wave device can be obtained which can prevent reflection of surface waves and thus reduce noise.

What we claim is:

1. An elastic surface wave device comprising a piezoelectric substrate; interdigital type input and output transducers provided on one surface of the piezoelectric substrate and mutually spaced apart from each other to define a surface wave propagation path therebetween; and a surface wave absorber partially overlappingly provided on that end surface portion of at least one of the input and output transducers which lies on an extension of the surface wave propagation path, said surface wave absorber having end edges diagonally intersecting with respect to the surface wave propagation path.

2. An elastic surface wave device according to claim 1, in which said input transducer comprises a pair of interdigital electrodes, said interdigital electrodes including a plurality of mutually overlapped digit electrodes the overlapped portions of which are varied in either width or length according to a weighted pattern; and said surface wave absorber is provided on the non-overlapped portions of the digit electrodes and includes opposite side edges diagonally intersecting with respect to the surface wave propagation direction along the weighted pattern.

3. An elastic surface wave device according to claim 2, in which said non-overlapped portions of the digit electrodes are coated with an electroconductive material to provide an integral film formation for each of said interdigital electrodes.

4. An elastic surface wave device according to claim 1, in which said surface wave absorber includes a serrated portion.

5. An elastic surface wave device according to claim 1, wherein all of the end edge portions of said surface wave absorber diagonally intersect with respect to the surface wave propagation direction.

6. An elastic surface wave device according to claim 1, wherein one edge of said surface wave absorber includes a notch therein, the opposite side edges of said notch diagonally intersecting with respect to the surface wave propagation path.

7. An elastic surface wave device according to claim 6, wherein another end edge of said surface wave absorber, located away from the surface wave propagation path, has a serrated portion.

8. An elastic surface wave device according to claim 1, in which said surface wave absorber is partially overlappingly provided on the input transducer, and further comprising a further surface wave absorber located between the output transducer and one end of the piezoelectric substrate.

9. An elastic surface wave device according to claim 8, in which said surface wave absorbers each include a serrated portion.

* * * * *